US012127345B2

(12) United States Patent
Huang et al.

(10) Patent No.: US 12,127,345 B2
(45) Date of Patent: Oct. 22, 2024

(54) DISPLAY APPARATUS AND ELECTRONIC DEVICE

(71) Applicants: Chengdu BOE Optoelectronics Technology Co., Ltd., Sichuan (CN); BOE Technology Group Co., Ltd., Beijing (CN)

(72) Inventors: Xiaoxia Huang, Beijing (CN); Fan Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 272 days.

(21) Appl. No.: 17/779,572

(22) PCT Filed: Jun. 11, 2021

(86) PCT No.: PCT/CN2021/099826
§ 371 (c)(1),
(2) Date: May 25, 2022

(87) PCT Pub. No.: WO2022/017057
PCT Pub. Date: Jan. 27, 2022

(65) Prior Publication Data
US 2023/0008693 A1    Jan. 12, 2023

(30) Foreign Application Priority Data
Jul. 22, 2020   (CN) .......................... 202010712012.2

(51) Int. Cl.
*H05K 1/14*     (2006.01)
*H05K 1/11*     (2006.01)
*H05K 9/00*     (2006.01)

(52) U.S. Cl.
CPC ............. *H05K 1/147* (2013.01); *H05K 1/115* (2013.01); *H05K 9/0073* (2013.01); *H05K 2201/09545* (2013.01); *H05K 2201/10128* (2013.01)

(58) Field of Classification Search
CPC ................... H05K 1/147; H05K 1/115; H05K 1/0218–0227; H05K 9/0073;
(Continued)

(56) References Cited

U.S. PATENT DOCUMENTS 8,495,815 B2   7/2013   Izawa et al.
8,853,562 B2   10/2014  Izawa et al.
(Continued)

FOREIGN PATENT DOCUMENTS

CN   101707851 A   5/2010
CN   101896058 A   11/2010
(Continued)

OTHER PUBLICATIONS

International Search Report and Written Opinion mailed on Sep. 9, 2021, in corresponding PCT/CN2021/099826, 10 pages.

*Primary Examiner* — Hoa C Nguyen
(74) *Attorney, Agent, or Firm* — XSENSUS LLP

(57) ABSTRACT

The present disclosure relates to a display apparatus and an electronic device, relating to the technical field of display. The display apparatus may comprise a display panel, a main circuit board, a bridging circuit board, and a first shielding adhesive tape. The main circuit board may be provided on the back surface of the display panel; the bridging circuit board may be provided at the side of the main circuit board distant from the display panel, and may be connected to the main circuit board in a binding mode; and the first shielding
(Continued)

adhesive tape may be provided at the side of the main circuit board distant from the display panel, and expose the bridging circuit board.

18 Claims, 6 Drawing Sheets

(58) Field of Classification Search
CPC ....... H05K 9/0088; H05K 2201/09545; H05K 2201/10128; H05K 2201/0707
See application file for complete search history.

(56) References Cited

U.S. PATENT DOCUMENTS

| | | | |
|---|---|---|---|
| 9,214,290 | B2 | 12/2015 | Xie et al. |
| 9,232,633 | B2 | 1/2016 | Kim |
| 9,978,693 | B2 | 5/2018 | Jeong et al. |
| 10,204,869 | B2 | 2/2019 | Jeong et al. |
| 2010/0294559 | A1 | 11/2010 | Izawa et al. |
| 2012/0261181 | A1 | 10/2012 | Izawa et al. |
| 2013/0141912 | A1 | 6/2013 | Kim |
| 2013/0306452 | A1 | 11/2013 | Xie et al. |
| 2018/0090449 | A1* | 3/2018 | Jeong ............... H01L 23/552 |
| 2018/0233458 | A1 | 8/2018 | Jeong et al. |
| 2019/0341665 | A1* | 11/2019 | Baba ................. H05K 1/0239 |
| 2020/0168157 | A1 | 5/2020 | Kim et al. |
| 2020/0196496 | A1 | 6/2020 | Shin |

FOREIGN PATENT DOCUMENTS

| | | |
|---|---|---|
| CN | 101707851 B | 12/2011 |
| CN | 103152979 A | 6/2013 |
| CN | 103425301 A | 12/2013 |
| CN | 107871728 A | 4/2018 |
| CN | 111221382 A | 6/2020 |
| CN | 111710238 A | 9/2020 |
| CN | 212782484 U | 3/2021 |
| EP | 2254401 A2 | 11/2010 |
| EP | 2254401 B1 | 7/2013 |
| KR | 2020-0073086 A | 6/2020 |

* cited by examiner

DISPLAY APPARATUS AND ELECTRONIC DEVICE

CROSS-REFERENCE

The present application is the 371 application of PCT Application No. PCT/CN2021/099826, filed on Jun. 11, 2021, which is based upon and claims the priority to the Chinese Patent Application NO. 202010712012.2, entitled "DISPLAY APPARATUS AND ELECTRONIC DEVICE", filed on Jul. 22, 2020, the entire contents of which are hereby incorporated by reference.

TECHNICAL FIELD

The present disclosure relates to the field of display technologies, and in particular, to a display apparatus and an electronic device.

BACKGROUND

Display apparatuses typically include circuit boards that are electrically coupled to display panels. The circuit boards can be combinations of main circuit boards and bridging circuit boards, and the bridging circuit boards are bound to the main circuit boards for electrical connections between different leads on the main circuit boards.

It should be noted that the information disclosed in the Background section above is only for enhancing the understanding of the background of the present disclosure, and thus may include information that does not constitute prior art known to those of ordinary skill in the art.

SUMMARY

The present disclosure provides a display apparatus and an electronic device.

According to a first aspect of the present disclosure, there is provided a display apparatus, including:
a display panel:
a main circuit board, disposed on a back surface of the display panel:
a bridging circuit board, disposed on a side of the main circuit board away from the display panel, and coupled to the main circuit board in a binding mode; and
a first shielding adhesive tape, disposed on the side of the main circuit board away from the display panel, wherein the bridging circuit board is exposed by the first shielding adhesive tape.

According to a second aspect of the present disclosure, there is provided an electronic device, including the above-mentioned display apparatus.

BRIEF DESCRIPTION OF THE DRAWINGS

The above and other features and advantages of the present disclosure will become more apparent from the detailed description of embodiments thereof with reference to the drawings.

FIG. 1I is a schematic partial top-view structural diagram of a first shielding adhesive tape, a second shielding adhesive tape and a bridging circuit board according to an embodiment of the present disclosure.

DETAILED DESCRIPTION

Figure 1:
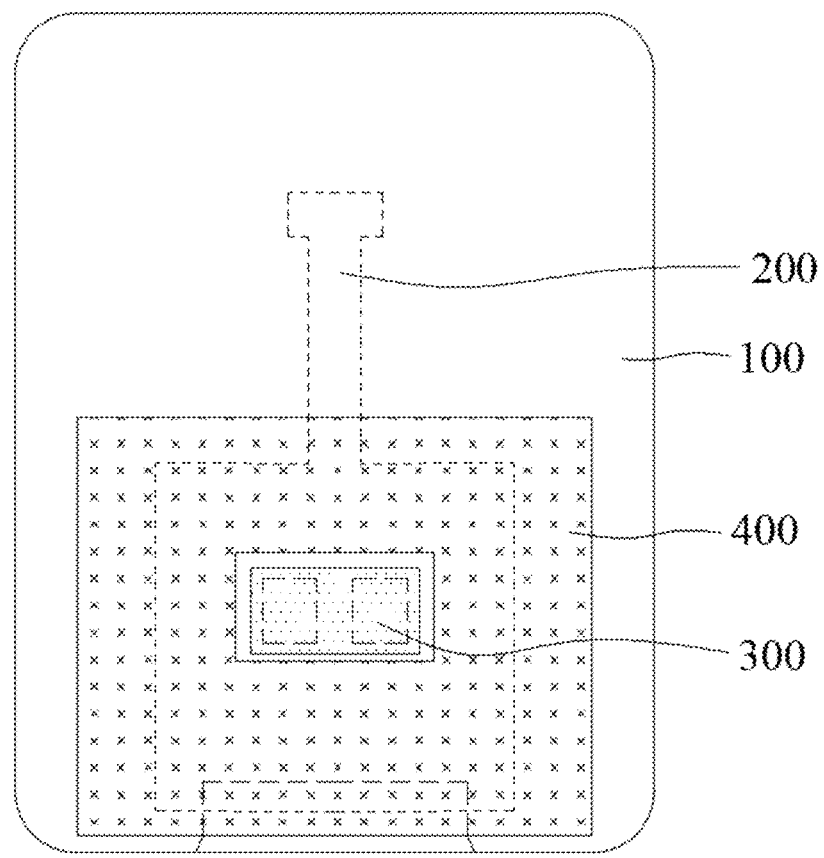
FIG. 1 is a schematic top-view structural diagram of a display apparatus according to an embodiment of the present disclosure.

Embodiments will now be described more fully with reference to the drawings. However, the embodiments can be implemented in a variety of forms and should not be construed as being limited to examples set forth herein; rather, these embodiments are provided so that the present disclosure will be more full and complete so as to convey the idea of the embodiments to those skilled in this art. The described features, structures, or characteristics in one or more embodiments may be combined in any suitable manner. In the following description, many specific details are provided to give a full understanding of the embodiments of the present disclosure.

In the figures, thicknesses of areas and layers may be exaggerated for clarity. The same reference numerals in the drawings denote the same or similar structures, and thus their detailed descriptions will be omitted.

The described features, structures, or characteristics in one or more embodiments may be combined in any suitable manner. In the following description, many specific details are provided to give a full understanding of the embodiments of the present disclosure. However, those skilled in the art will appreciate that the technical solutions of the present disclosure may be practiced without one or more of the specific details, or other methods, components, materials, and the like may be employed. In other instances, well-known structures, materials or operations are not shown or described in detail to avoid obscuring main technical ideas of the present disclosure.

The terms "include" and "provided with" are used to indicate an open meaning of including and means that there may be additional elements/components/etc. in addition to the listed elements/components/etc. The terms "first" and "second" etc. are used only as markers, and do not limit the number of objects.

Figure 2:
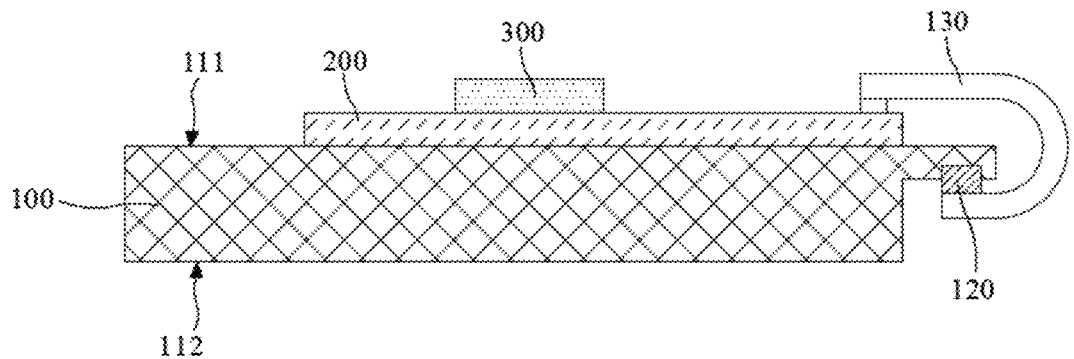
FIG. 2 is a schematic side-view structural diagram of a display apparatus according to an embodiment of the present disclosure.
Figure 7:
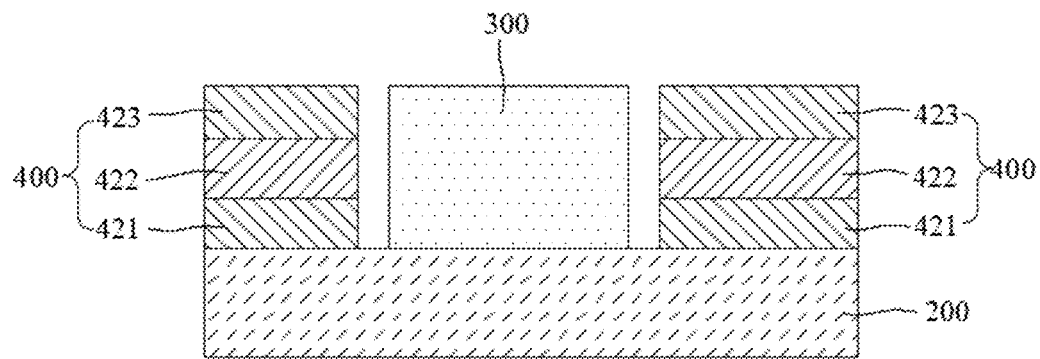
FIG. 7 is a schematic partial cross-section structural diagram of a first shielding adhesive tape, a main circuit board, and a bridging circuit board according to an embodiment of the present disclosure.

The present disclosure provides a display apparatus. As shown in FIG. 1, the display apparatus includes a display panel 100, a main circuit board 200 (indicated by dotted lines in FIG. 1), a bridging circuit board 300 and a first shielding adhesive tape 400. As shown in FIG. 2 (the first shielding adhesive tape 400 is not shown) and FIG. 3 (the first shielding adhesive tape 400 is not shown), the main circuit board 200 is disposed on a back surface 111 of the display panel 100, and the bridging circuit board 300 is disposed on a side of the main circuit board 200 away from the display panel 100 and coupled to the main circuit board 200 in a binding mode. As shown in FIG. 7, the first shielding adhesive tape 400 is disposed on the side of the main circuit board 200 away from the display panel 100 and exposes the bridges circuit board 300.

In the display apparatus provided by the present disclosure, the first shielding adhesive tape 400 exposes the bridging circuit board 300, so as to avoid damage to the first shielding adhesive tape 400 caused by the bridging circuit board 300, thereby facilitating to make a state of the first shielding adhesive tape 400 remain stable, avoiding possible and uncontrolled damage of the first shielding adhesive tape 400 leading to uncontrollable changes in its shielding properties, and avoiding such uncontrollable changes leading to unpredictable changes in an electromagnetic environment in which the main circuit board 200 and the bridging circuit board 300 are located. Not only that, since the first shielding adhesive tape 400 exposes the bridging circuit board 300, a risk of short circuit between the bridging circuit board 300 and the first shielding adhesive tape 400 is avoided, and the stability of the bridging circuit board 300 is improved. This generally improves electrical stability of the display apparatus.

A structure, principle and effect of the display apparatus provided by the present disclosure will be further explained and described with reference to the drawings below.

The display apparatus provided by the present disclosure may be a smart phone screen, a computer display, a television screen, a smart watch screen, or other types of apparatuses for display, which are not particularly limited by the present disclosure. The display apparatus may include the display panel 100, and the display panel 100 may be an Organic Light-emitting Device (OLED) display panel, a Polymer Light-emitting Device (PLED) display panel, a Micro Light Emitting Diode (Micro LED) display panel, a Mini Light Emitting Diode (Mini LED) display panel, a Liquid Crystal Display (LCD) display panel or other types of display panels, which are not particularly limited in the present disclosure.

In some embodiments of the present disclosure, the display panel 100 may also be a touch display panel. In this way, the display panel 100 has both touch and display functions. For example, the display panel 100 can be an in-cell touch display panel, so that a thickness of the display panel 100 can be reduced.

In some embodiments of the present disclosure, the display panel 100 may be an under-screen fingerprint recognition display panel, so that the display panel 100 has both fingerprint recognition and display functions. For example, the display panel 100 may be an in-cell under-screen fingerprint recognition display panel, so that the thickness of the display panel 100 can be reduced.

In addition, the display panel 100 may also be a display panel 100 integrated with touch and fingerprint recognition functions.

Figure 3:
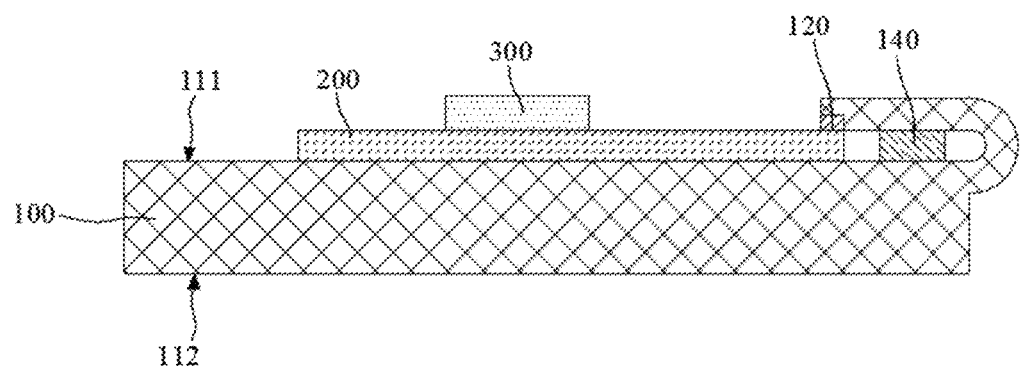
FIG. 3 is a schematic side-view structural diagram of a display apparatus according to an embodiment of the present disclosure.

Referring to FIGS. 2 and 3, the display panel 100 has a light emitting surface 112 and a back surface 111 disposed opposite to each other. That is, the back surface 111 of the display panel 100 refers to a surface disposed opposite to the light emitting surface 112. Light emitted by the display panel 100 is emitted outward from the light emitting surface 112, that is, the light emitted by the display panel 100 is emitted in a direction away from the back surface 111 of the display panel 100.

In the present disclosure, a thickness of each component, such as the display panel 100, the main circuit board 200, the bridging circuit board 300, the first shielding adhesive tape 400 or other components, refers to a dimension of the component along a direction perpendicular to the back surface 111 the display panel 100. For example, the thickness of the display panel 100 is a dimension of the display panel 100 along the direction perpendicular to its back surface 111, that is, a distance between the light emitting surface 112 and the backlight surface 111 of the display panel 100. For another example, a thickness of the first shielding adhesive tape 400 refers to a dimension of the first shielding adhesive tape 400 along the direction perpendicular to the back surface 111 of the display panel 100, that is, a distance between a surface of the first shielding adhesive tape 400 close to the display panel 100 and a surface of the first shielding adhesive tape 400 away from the display panel 100. For still another example, a thickness of the bridging circuit board 300 refers to a dimension of the bridging circuit board 300 along the direction perpendicular to the back surface 111 of the display panel 100, that is, a distance between a surface of the bridging circuit board 300 close to the display panel 100 and a surface of the bridging circuit board 300 away from the display panel 100.

As shown in FIG. 2 and FIG. 3, the display panel 100 may have a bonding area provided with a plurality of bonding pads 120, and the bonding pads 120 may be directly or indirectly electrically coupled to the main circuit board 200.

In an embodiment of the present disclosure, as shown in FIG. 2, the bonding pads 120 of the display panel 100 can be coupled to a chip encapsulation structure in a binding mode, and the main circuit board 200 can be coupled to the chip encapsulation structure in the binding mode. In this way, the main circuit board 200 is indirectly electrically coupled to the bonding pads 120 of the display panel 100 through the chip encapsulation structure. For example, the chip encapsulation structure may be a Chip On Film (COF) 130.

In another embodiment of the present disclosure, as shown in FIG. 3, the main circuit board 200 may be directly coupled with the bonding pads 120 of the display panel 100 in the binding mode. For example, the display panel 100 further includes a chip encapsulation area within which a driving chip 140 can be encapsulated. The driving chip 140 can be electrically coupled to at least part of leads of a display area of the display panel 100 and a part of the bonding pads 120. In this way, the display apparatus can implement Chip On Glass or Chip On Panel (COP) encapsulation.

As shown in FIG. 2 and FIG. 3, the main circuit board 200 is disposed on the back surface 111 of the display panel 100 for direct or indirect electrical connection with the display panel 100. In some embodiments of the present disclosure, the main circuit board 200 may be a flexible circuit board.

In an embodiment of the present disclosure, the main circuit board 200 is provided with at most two lead layers, and any one lead layer includes a plurality of signal leads. The display panel 100 of the present disclosure avoids using a main circuit board 200 with three or more layers, so as to avoid the increase in the number of lead layers of the main circuit board 200 resulting in a substantial increase in the cost and thickness of the main circuit board 200, thereby reducing the cost and thickness of the display apparatus.

For example, the main circuit board 200 may be provided with two lead layers. In this way, the cost of the main circuit board 200 can be prevented from being too high, and a density of signal leads in each lead layer can be also prevented from being too large. In addition, crosstalk between the signal leads caused by too high signal lead density and an impedance increase due to the decrease of a signal lead width are avoided, and the electrical stability of the main circuit board 200 is improved.

Figure 4:
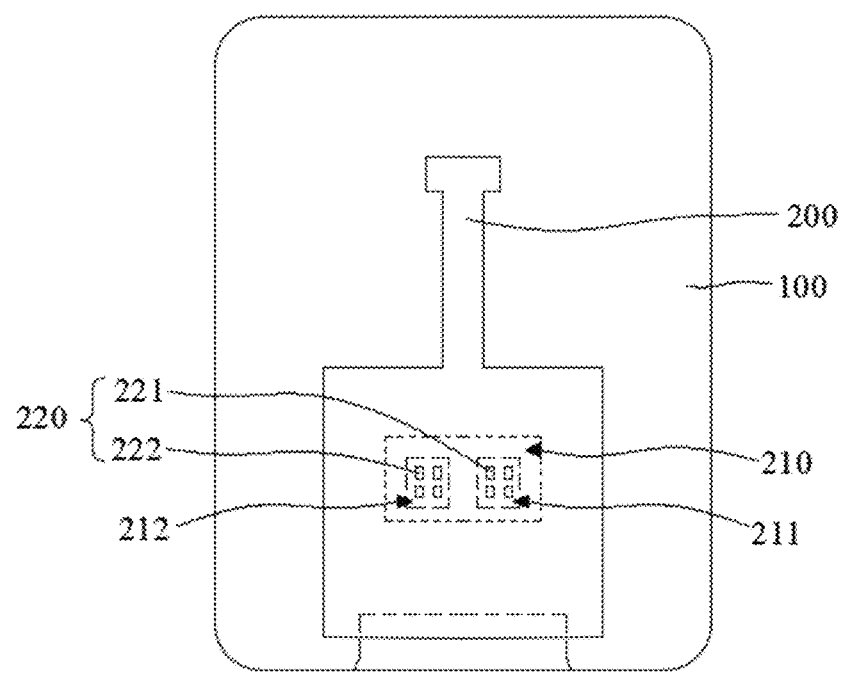
FIG. 4 is a schematic top-view structural diagram of a main circuit board according to an embodiment of the present disclosure.

In some embodiments of the present disclosure, as shown in FIG. 4, the main circuit board 200 is provided with a main bridging area 210, and the main bridging area 210 is provided with a main bridging pad 220 electrically coupled to at least part of the signal leads in the main circuit board 200. The main bridging pad 220 is used to be coupled with the bridging circuit board 300, and connections between different signal leads are achieved by means of bridging leads in the bridging circuit board 300.

For example, as shown in FIG. 4, the main bridging area 210 includes a first main pad distribution area 211 and a second main pad distribution area 212. The main bridging pad 220 includes a plurality of first main bridging pads 221 and a plurality of second main bridging pads 222. The first main bridging pads 221 are arranged in the first main pad distribution area 211, and any one of the first main bridging pads 221 is electrically coupled to one signal lead. The second main bridging pads 222 are arranged in the second main pad distribution area 212, and any one of the second main bridging pads 222 is electrically coupled to one signal lead.

Figure 5:
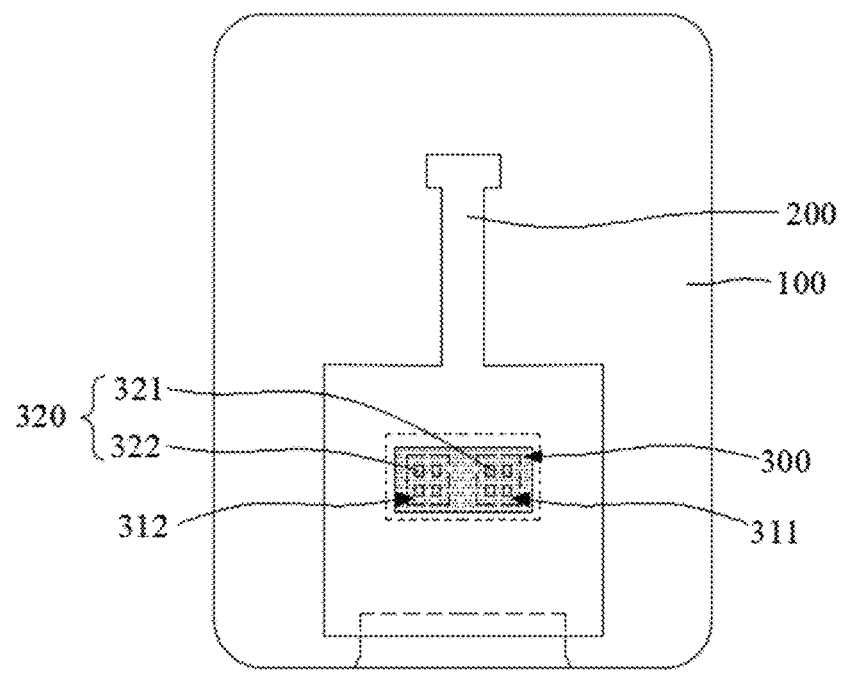
FIG. 5 is a schematic top-view structural diagram of a main circuit board and a bridging circuit board according to an embodiment of the present disclosure.

As shown in FIGS. 2 and 3, the bridging circuit board 300 is disposed on the side of the main circuit board 200 away from the display panel 100, and is coupled to the main circuit board 200 in the binding mode. As shown in FIG. 5, the bridging circuit board 300 may include a secondary bridging pad 320 disposed on a surface of the bridging circuit board 300 close to the main circuit board 200 and a bridging lead disposed within the bridging circuit board 300, and the bridging lead is electrically coupled with the secondary bridging pad 320. In an embodiment of the present disclosure, one bridging lead may be coupled to at least two different secondary bridging pads 320, so as to connect at least two different signal leads.

In an embodiment of the present disclosure, the bridging circuit board 300 includes at most two lead layers, and any one lead layer includes a plurality of bridging leads. In this way, the display panel 100 of the present disclosure avoids using a bridging circuit board 300 with three or more layers, so as to avoid the increase in the number of lead layers of the bridging circuit board 300 resulting in a substantial increase in the cost and thickness of the bridging circuit board 300, thereby reducing the cost and thickness of the display apparatus.

For example, the bridging circuit board 300 may be provided with two lead layers. In this way, the cost of the bridging circuit board 300 can be prevented from being too high, and a density of bridging leads in each lead layer can be prevented from being too large. In addition, crosstalk between the bridging leads caused by too high bridging lead density and an impedance increase due to the decrease of a bridging lead width are avoided, and the electrical stability of the bridging circuit board 300 is improved.

Figure 8:
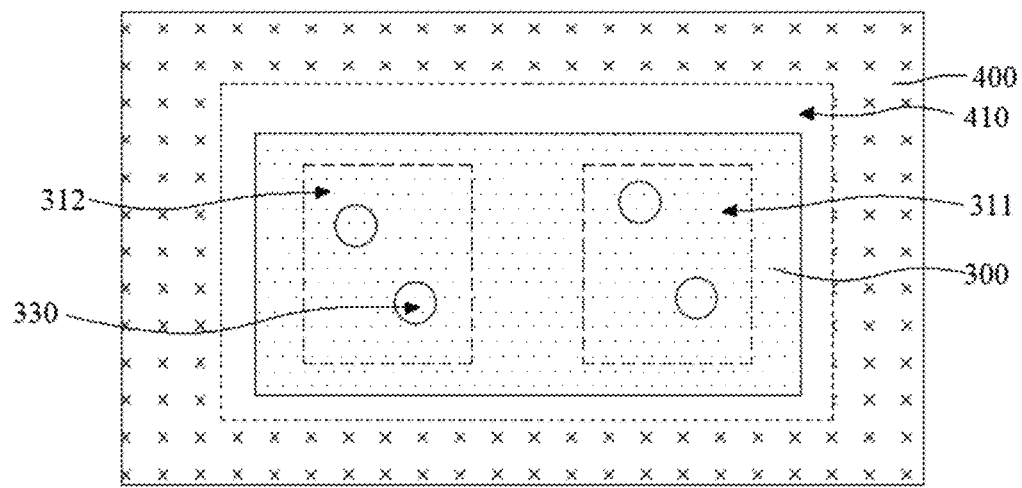
FIG. 8 is a schematic partial top-view structural diagram of a first shielding adhesive tape and a bridging circuit board according to an embodiment of the present disclosure.

For example, as shown in FIG. 4 and FIG. 8, the surface of the bridging circuit board 300 close to the main circuit board 200 includes a first secondary pad distribution area 311 and a second secondary pad distribution area 312. The secondary bridging pad 320 includes a plurality of first secondary bridging pads 321 and a plurality of second secondary bridging pads 322. The first secondary bridging pads 321 are arranged in the first secondary pad distribution area 311, respective first secondary bridging pads 321 are coupled to respective first main bridging pads 221 in a one-to-one correspondence, and any one of the first secondary bridging pads 321 is electrically coupled to one bridging lead. The second secondary bridging pads 322 are arranged in the second secondary pad distribution area 312, and respective second secondary bridging pads 322 are coupled to respective second main bridging pads 222 in a one-to-one correspondence, and any one of the second secondary bridging pads 322 is electrically coupled to one bridging lead.

For example, as shown in FIG. 8, the bridging circuit board 300 is further provided with a metallized via 330 used to lead out the bridging lead, so that the bridging lead is coupled to the secondary bridging pad 320. Further, the surface of the bridging circuit board 300 close to the main circuit board 200 is provided with a plurality of connection leads, and each connection lead connects the secondary bridging pad 320 with the metallized via 330, and the metallized via 330 is coupled to the bridging lead. In this way, the bridging lead can be coupled to the secondary bridging pad 320 through the metallized via 330.

In an embodiment of the present disclosure, the display panel 100 is a touch display panel 100. The main circuit board 200 includes two lead layers, specifically including a first main lead layer close to the display panel 100 and a second main lead layer on a side of the first main lead layer away from the display panel 100, and the first main lead layer and the second main lead layer are isolated from each other by an insulating layer. The first main lead layer includes a plurality of first signal leads. A part of the first signal leads are used to transmit display-related signals, such as data signals, and a part of the first signal leads are used to transmit touch-related signals, such as touch detection signals. The second main lead layer includes a plurality of second signal leads. A part of the second signal leads are used to transmit display-related signals, such as the data signals, and a part of the second signal leads are used to transmit touch-related signals, such as the touch detection signals. The main circuit board 200 is provided with the main bridging area 210 including the first main pad distribution area 211 and the second main pad distribution area 212, and the first main pad distribution area 211 is provided with the plurality of first main bridging pads 221, and the second main pad distribution area 212 is provided with the plurality of second main bridging pads 222. A part of the first main bridging pads 221 are electrically coupled to first signal leads through conductive vias, and the rest of the first main bridging pads 221 are electrically coupled to second signal leads through the conductive vias. A part of the second main bridging pads 222 are electrically coupled to the first signal leads through the conductive vias, and the rest of the second main bridging pads 222 are electrically coupled to the second signal leads through the conductive vias.

In this embodiment, the bridging circuit board 300 includes two lead layers, specifically including a first bridging lead layer close to the main circuit board 200 and a second bridging lead layer on a side of the first bridging lead layer away from the display panel 100, and the first bridging lead layer and the second bridging lead layer are isolated from each other by the insulating layer. The first bridging lead layer includes a plurality of first bridging leads, and the second bridging lead layer includes a plurality of second bridging leads. The surface of the bridging circuit board 300 close to the main circuit board 200 includes the first secondary pad distribution area 311 and the second secondary pad distribution area 312. The first secondary pad distribution area 311 is provided with the plurality of first secondary bridging pads 321, respective first secondary bridging pads 321 are coupled to respective first main bridging pads 221 in a one-to-one correspondence, and any one of the first secondary bridging pads 321 is coupled to one bridging lead through the metallized via 330. The second secondary pad distribution area 312 is provided with the plurality of second secondary bridging pads 322, respective second secondary bridging pads 322 are coupled to respective second main bridging pads 222 in a one-to-one correspondence, and any one of the second secondary bridging pads is coupled to one bridging lead through the metallized via 330.

As shown in FIG. 7, in the display apparatus of the present disclosure, the first shielding adhesive tape 400 is disposed on the side of the main circuit board 200 away from the display panel 100 to protect the main circuit board 200 and provide electromagnetic shielding for the main circuit board 200. For example, an orthographic projection of the first shielding adhesive tape 400 on the main circuit board 200 is not overlapped with an orthographic projection of the bridging circuit board 300 on the main circuit board 200 at all. In this way, the first shielding adhesive tape 400 completely exposes the bridging circuit board 300.

In some embodiments of the present disclosure, the first shielding adhesive tape 400 may be adhered to the side of the main circuit board 200 away from the display panel 100. For example, as shown in FIG. 1, the first shielding adhesive tape 400 may also extend beyond an edge of the main circuit board 200, so that a part of the first shielding adhesive tape 400 is adhered to the back surface 111 of the display panel 100, and the other part is adhered to a surface of the main circuit board 200 away from the display panel 100. In this way, the first shielding adhesive tape 400 can not only improve the electromagnetic shielding effect for the main circuit board 200 and in turn improve the electrical stability of the main circuit board 200, but also can improve the electromagnetic shielding effect for the display panel 100 and in turn improve the electromagnetic stability of the display panel 100. Not only that, the shielding adhesive tape can also play a fixing role, so that the main circuit board 200 can be more firmly fixed to the display panel 100.

For example, as shown in FIG. 1, the first shielding adhesive tape 400 covers a part of the main circuit board 200 and exposes at least part of the main circuit board 200. In an embodiment of the present disclosure, the main circuit board 200 includes an interface component used for an electrical connection between the main circuit board 200 and another circuit structure, for example, an electrical connection between the main circuit board 200 and a timing controller. The first shielding adhesive tape 400 may expose the interface component of the main circuit board 200.

For example, when the main circuit board 200 is coupled to the display panel 100 through the chip on film 130, the first shielding adhesive tape 400 can cover part or all of the chip on film 130, so as to improve the electromagnetic shielding effect for the chip on film 130 and improve the electrical stability of the chip on film 130.

In an embodiment of the present disclosure, the first shielding adhesive tape 400 may be provided with a bridging notch exposing the bridging circuit board 300, and the bridging circuit board 300 may be disposed within the bridging notch. In other words, the first shielding adhesive tape 400 may not completely surround the bridging circuit board 300 to facilitate the attachment and alignment of the first shielding adhesive tape 400.

Figure 6:
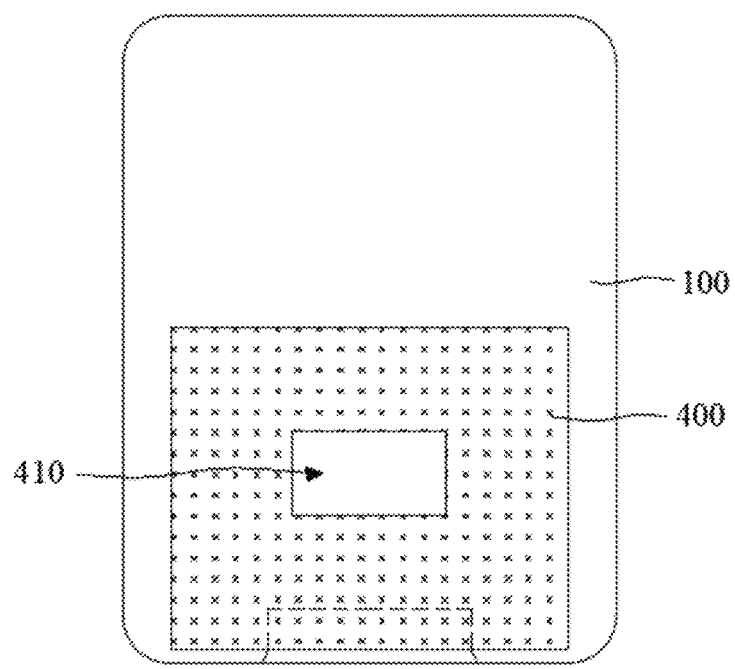
FIG. 6 is a schematic top-view structural diagram of a first shielding adhesive tape according to an embodiment of the present disclosure.

In another embodiment of the present disclosure, as shown in FIGS. 1 and 6, the first shielding adhesive tape 400 is provided with a bridging opening 410, and the bridging circuit board 300 is within the bridging opening 410. In other words, the first shielding adhesive tape 400 can completely surround the bridging circuit board 300, so that the first shielding adhesive tape 400 can achieve better shielding effect.

In some embodiments of the present disclosure, the minimum value of a distance between any point on the bridging circuit board 300 and any point on the first shielding adhesive tape 400 is equal to 0.3-0.8 mm. That is, a gap between the bridging circuit board 300 and the first shielding adhesive tape 400 is 0.3-0.8 mm In this way, it is possible to avoid a partial overlapping between the first shielding adhesive tape 400 and the bridging circuit board 300 caused by the influence of factors such as an alignment deviation and an attachment deviation generated when the first shielding adhesive tape 400 is attached, possible deformation generated by the first shielding adhesive tape 400, and a dimensional deviation and a position deviation that may be generated by the bridging circuit board 300, and guarantee the separation of the first shielding adhesive tape 400 and the bridging circuit board 300, thereby preventing the first shielding adhesive tape 400 from being damaged unexpectedly.

Further, in some embodiments of the present disclosure, the minimum value of the distance between any point on the bridging circuit board 300 and any point on the first shielding adhesive tape 400 is equal to 0.5 mm. That is, the gap between the bridging circuit board 300 and the first shielding adhesive tape 400 is 0.5 mm.

In an embodiment of the present disclosure, as shown in FIGS. 1 and 6, the first shielding adhesive tape 400 is provided with the bridging opening 410, and the bridging circuit board 300 is within the bridging opening 410. The gap between the bridging circuit board 300 and the first shielding adhesive tape 400 is annular, and a width of the annular gap is 0.3-0.8 mm.

In an embodiment of the present disclosure, an orthographic projection of the bridging opening 410 of the first shielding adhesive tape 400 on the main circuit board 200 is coincided with the main bridging area 210 of the main circuit board 200.

In some embodiments of the present disclosure, the thickness of the bridging circuit board 300 is equal to 0.8-1.2 times the thickness of the first shielding adhesive tape 400. In this way, the thickness of the bridging circuit board 300 is substantially the same as the thickness of the first shielding adhesive tape 400, which can make the back surface 111 of the display apparatus relatively flat. For example, the thickness of the bridging circuit board 300 is the same as the thickness of the first shielding adhesive tape 400.

In some embodiments of the present disclosure, the thickness of the bridging circuit board 300 is equal to 0.09-0.14 mm, and the thickness of the first shielding adhesive tape 400 is equal to 0.09-0.14 mm. In this way, the thickness of the bridging circuit board 300 is substantially the same as the thickness of the first shielding adhesive tape 400, which can make the back surface 111 of the display apparatus relatively flat. Not only that, the bridging circuit board 300 and the first shielding adhesive tape 400 have smaller thicknesses, which facilitates to reduce the thickness of the display apparatus.

For example, the thickness of the bridging circuit board 300 is 0.11-0.12 mm, and the thickness of the first shielding adhesive tape 400 is 0.11-0.12 mm.

In some embodiments of the present disclosure, as shown in FIG. 7, the first shielding adhesive tape 400 may include a first insulating layer 421, a first conductive material layer 422 and a second insulating layer 423 that are stacked in sequence, and the first insulating layer 421 is disposed on a side of the first conductive material layer 422 close to the display panel 100. For example, the first insulating layer 421 and the second insulating layer 423 may be insulating adhesive tapes. For example, the first conductive material layer 422 may be a conductive cloth.

Further, in some embodiments of the present disclosure, the first conductive material layer 422 may be used to load a ground signal, so as to provide a more stable electromagnetic shielding effect for the display apparatus.

Figure 9:
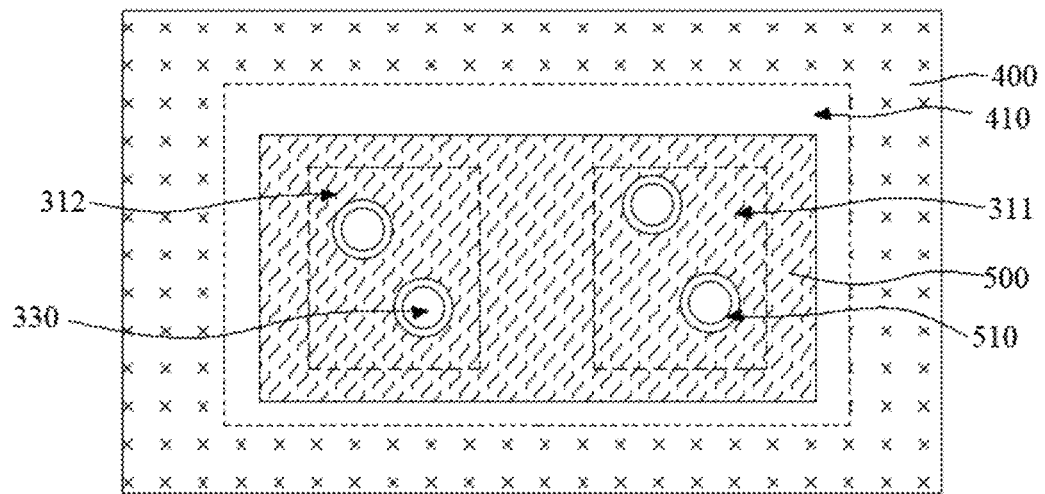
FIG. 9 is a schematic partial top-view structural diagram of a first shielding adhesive tape, a second shielding adhesive tape and a bridging circuit board according to an embodiment of the present disclosure.
Figure 10:
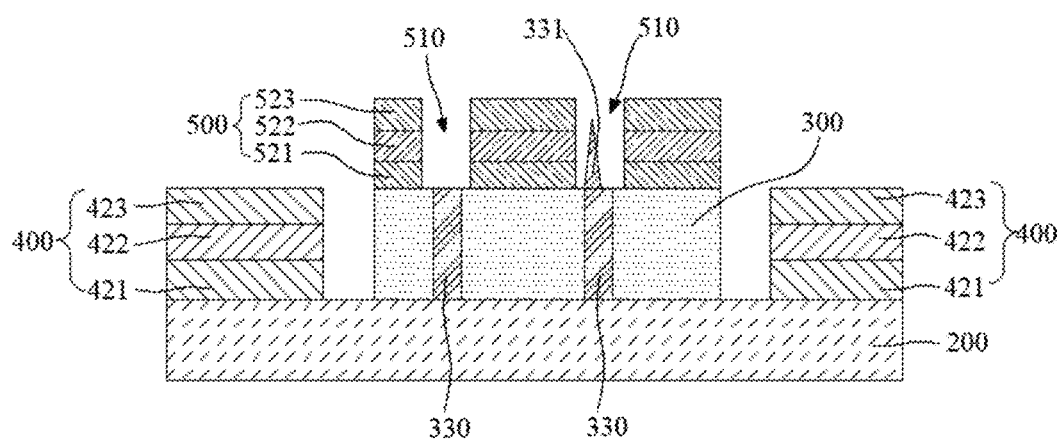
FIG. 10 is a schematic partial cross-section structural diagram of a first shielding adhesive tape, a second shielding adhesive tape, a main circuit board and a bridging circuit board according to an embodiment of the present disclosure.

In some embodiments of the present disclosure, as shown in FIGS. 8 to 10, the bridging circuit board 300 is provided with a plurality of metallized vias 330. The display apparatus further includes a second shielding adhesive tape 500 disposed on a side of the bridging circuit board 300 away from the display panel 100, and an orthographic projection of the second shielding adhesive tape 500 on the bridging circuit board 300 is not overlapped with each of the metallized vias 330.

It can be understood that, as shown in FIG. 10, positions of the metallized vias 330 are prone to unevenness. For example, uncontrollable and unpredictable protrusion structures 331 are easily generated during preparation and bonding processes. These protrusion structures 331 are usually formed from metal materials in the metallized vias 330. Therefore, although the bridging circuit board 300 may be provided with a protective layer covering the metallized vias 330, if the metallized vias 330 are covered with the shielding adhesive tapes, these shielding adhesive tapes may not only generate folds, but also have a possibility of be pricked through by these protrusion structures 331. This may result in the short circuit between the metallized via 330 and the shielding adhesive tape, which causes the failure of the bridging circuit board 300 and the decrease of the electrical stability of the bridging circuit board 300.

In an embodiment of the present disclosure, as shown in FIG. 10, the second shielding adhesive tape 500 does not cover each of the metallized vias 330. Accordingly, on the one hand, the second shielding adhesive tape 500 can achieve the electromagnetic shielding for the bridging circuit board 300, improve the electromagnetic shielding effect for the bridging circuit board 300 and in turn improve the electrical stability of the bridging circuit board 300; on the other hand, the metallized vias 330 that may cause the unexpected damage to the second shielding adhesive tape 500 are avoided, and the possibility of damage to the second shielding tape 500 is avoided.

Further, in some embodiments of the present disclosure, as shown in FIG. 9 (the bridging circuit board is covered by the second shielding adhesive tape) and FIG. 10, the second shielding adhesive tape 500 is provided with a plurality of avoidance openings 510 disposed in a one-to-one correspondence with the plurality of metallized vias 330, and any one of the metallized vias 330 is located within an orthographic projection of the corresponding avoidance opening 510 on the bridging circuit board 300. In other words, in a top view, the second shielding adhesive tape 500 may surround each of the metallized vias 330 without covering each of the metallized vias 330. In this way, an area of the second shielding adhesive tape 500 can be increased, and the shielding effect for the bridging circuit board 300 can be improved.

Further, in some embodiments of the present disclosure, the minimum value of a distance between any point of the metallized via 330 and any point of the orthographic projection of the second shielding adhesive tape 500 on the bridging circuit board 300 is equal to 0.3-0.8 mm. In other words, a gap between the orthographic projection of the second shielding adhesive tape 500 on the bridging circuit board 300 and the metallized via 330 is 0.3-0.8 mm. In this way, it is possible to avoid a partial overlapping between the second shielding adhesive tape 500 and the metallized via 330 caused by the influence of factors such as an alignment deviation and an attachment deviation generated when the second shielding adhesive tape 500 is attached, and possible deformation generated by the second shielding adhesive tape 500, and guarantee that the second shielding adhesive tape 500 is not overlapped with the metallized via 330, thereby preventing the second shielding adhesive tape 500 from being damaged unexpectedly.

For example, the minimum value of the distance between any point of the metallized via 330 and any point of the orthographic projection of the second shielding adhesive tape 500 on the bridging circuit board 300 is equal to 0.5 mm. In other words, the gap between the orthographic projection of the second shielding adhesive tape 500 on the bridging circuit board 300 and the metallized via 330 is 0.5 mm.

In an embodiment of the present disclosure, the second shielding adhesive tape 500 is provided with the plurality of avoidance openings 510 disposed in a one-to-one correspondence with the plurality of metallized vias 330. Any one of the metallized vias 330 is located within the orthographic projection of the corresponding avoidance opening 510 on the bridging circuit board 300. There is an annular gap between any one of the metallized vias 330 and an edge of the orthographic projection of the corresponding avoidance opening 510 on the bridging circuit board 300, and a width of the annular gap is equal to 0.3-0.8 mm.

In some embodiments of the present disclosure, as shown in FIG. 10, the second shielding adhesive tape 500 may include a third insulating layer 521, a second conductive material layer 522 and a fourth insulating layer 523 that are stacked in sequence, and the third insulating layer 521 is disposed on a side of the second conductive material layer 522 close to the main circuit board 200. For example, the third insulating layer 521 and the fourth insulating layer 523 may be the insulating tapes. For example, the second conductive material layer 522 may be the conductive cloth.

Further, in some embodiments of the present disclosure, the second conductive material layer 522 may be used to load the ground signal, so as to provide a more stable electromagnetic shielding effect for the display apparatus.

In an embodiment of the present disclosure, the orthographic projection of the second shielding adhesive tape 500 on the bridging circuit board 300 is located within the bridging circuit board 300, and the minimum value of a distance between any point on an outer edge of the second shielding adhesive tape 500 and any point on an edge of the bridging circuit board 300 is equal to 0-0.5 mm. In other words, a gap between the outer edge of the second shielding adhesive tape 500 and the edge of the bridging circuit board 300 is 0-0.5 mm. Further, there is an annular gap between the orthographic projection of the second shielding adhesive tape 500 on the bridging circuit board 300 and the edge of the bridging circuit board 300, and a width of the annular gap may be 0-0.5 mm.

In this way, the second shielding adhesive tape 500 can not only cover the bridging circuit board 300 as much as possible, but also prevent the second shielding adhesive tape 500 from being beyond the edge of the bridging circuit board 300 and causing difficulty in aligning the second shielding adhesive tape 500 with the bridging circuit board 300, and reduce an alignment deviation during an attaching process of the second shielding adhesive tape 500, thereby preventing the second shielding adhesive tape 500 from being overlapped with the metallized via 330.

Figure 11:
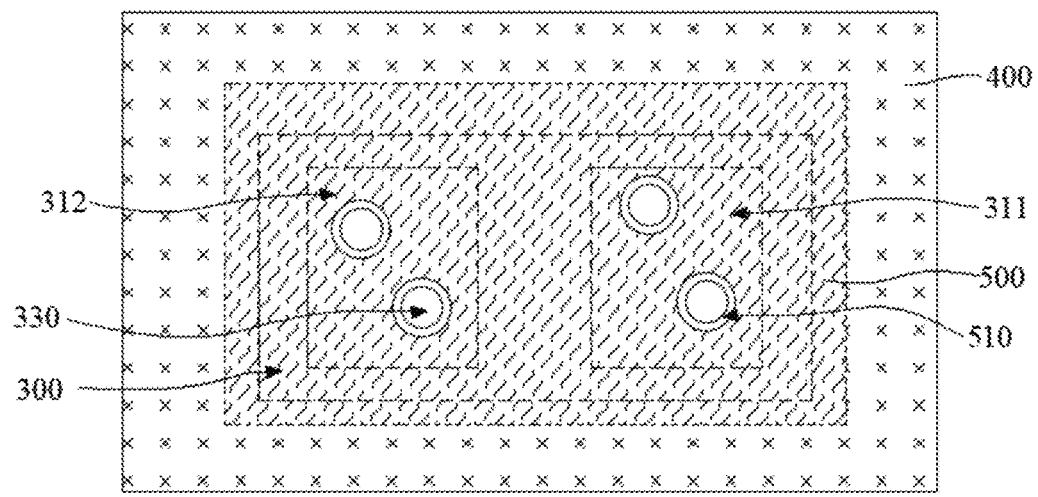

In another embodiment of the present disclosure, as shown in FIG. 11 (the bridging circuit board is blocked by the second shielding adhesive tape), the second shielding adhesive tape 500 and the first shielding adhesive tape 400 are coupled in an integrated structure. In other words, the display apparatus may be provided with a shielding adhesive tape including a first part and a second part that are coupled, the first part may be used as the first shielding adhesive tape 400 described in the embodiments of the present disclosure, and the second part may be used as the second shielding adhesive tape 500 described in the embodiments of the present disclosure. The first shielding adhesive tape 400 covers at least part of the main circuit board 200 but completely exposes the bridging circuit board 300, and the second shielding adhesive tape 500 covers part of the bridging circuit board 300 without covering the metallized vias 330 of the bridging circuit board 300. In this way, the second shielding adhesive tape 500 and the first shielding adhesive tape 400 which are integrally coupled can achieve better electromagnetic shielding effect, and only one attaching process is required, which simplifies an assembly process of the display apparatus.

The embodiments of the present disclosure further provide an electronic device, including any one of the display apparatuses described in the above-mentioned display apparatus embodiments. The electronic device may be a smart phone, a notebook computer, a tablet computer, a smart computer or other types of electronic devices. Since the electronic device has any one of the display apparatuses described in the above-mentioned display apparatus embodiments, it has the same beneficial effects, and details are not described herein again in the present disclosure.

It should be understood that the present disclosure is not limited to the detailed structure and arrangement of the components proposed by the present specification. The present disclosure is capable of having other embodiments, and be carried out and implemented in various manners. The foregoing variations and modifications fall within the scope of the present disclosure. It should be understood that the present disclosure disclosed and defined by the present specification extends to all alternative combinations of two or more of the individual features apparent or recited herein and/or in the drawings. All of these various combinations constitute a number of alternative aspects of the present disclosure. The embodiments described in the present specification are illustrative of the best mode for carrying out the invention and will enable those skilled in the art to utilize the present disclosure.

What is claimed is:

1. A display apparatus, comprising:
    a display panel;
    a main circuit board, disposed on a back surface of the display panel;
    a bridging circuit board, disposed on a side of the main circuit board away from the display panel, and coupled to the main circuit board in a binding mode; and
    a first shielding adhesive tape, disposed on the side of the main circuit board away from the display panel, wherein the bridging circuit board is exposed by the first shielding adhesive tape;
    wherein the bridging circuit board is provided with a plurality of metallized vias; and
    the display apparatus further comprises a second shielding adhesive tape, disposed on a side of the bridging circuit board away from the display panel, and an orthographic projection of the second shielding adhesive tape on the bridging circuit board is not overlapped with each metallized via.

2. The display apparatus according to claim 1, wherein the first shielding adhesive tape is provided with a bridging opening, and the bridging circuit board is within the bridging opening.

3. The display apparatus according to claim 1, wherein a gap between the bridging circuit board and the first shielding adhesive tape is equal to 0.3-0.8 mm.

4. The display apparatus according to claim 1, wherein the main circuit board comprises at most two lead layers.

5. The display apparatus according to claim 1, wherein the bridging circuit board comprises at most two lead layers.

6. The display apparatus according to claim 1, wherein a thickness of the bridging circuit board is equal to 0.8-1.2 times a thickness of the first shielding adhesive tape.

7. The display apparatus according to claim 1, wherein a thickness of the bridging circuit board is equal to 0.09-0.14 mm, and a thickness of the first shielding adhesive tape is equal to 0.09-0.14 mm.

8. The display apparatus according to claim 1, wherein the second shielding adhesive tape is provided with a plurality of avoidance openings disposed in a one-to-one correspondence with the plurality of the metallized vias; and
    any one of the metallized vias is located within an orthographic projection of a corresponding avoidance opening on the bridging circuit board.

9. The display apparatus according to claim 8, wherein a gap between any one of the metallized vias and the orthographic projection of the second shielding adhesive tape on the bridging circuit board is equal to 0.3-0.8 mm.

10. The display apparatus according to claim 1, wherein the orthographic projection of the second shielding adhesive tape on the bridging circuit board is located within the bridging circuit board, and a gap between an outer edge of the second shielding adhesive tape and an edge of the bridging circuit board is equal to 0-0.5 mm.

11. The display apparatus according to claim 1, wherein the second shielding adhesive tape is coupled with the first shielding adhesive tape in an integrated structure.

12. An electronic device, comprising a display apparatus, wherein the display apparatus comprises:
    a display panel;
    a main circuit board, disposed on a back surface of the display panel;
    a bridging circuit board, disposed on a side of the main circuit board away from the display panel, and coupled to the main circuit board in a binding mode; and
    a first shielding adhesive tape, disposed on the side of the main circuit board away from the display panel, wherein the bridging circuit board is exposed by the first shielding adhesive tape;

wherein the bridging circuit board is provided with a plurality of metallized vias; and the display apparatus further comprises a second shielding adhesive tape, disposed on a side of the bridging circuit board away from the display panel, and an orthographic projection of the second shielding adhesive tape on the bridging circuit board is not overlapped with each metallized via.

13. The electronic device according to claim 12, wherein the first shielding adhesive tape is provided with a bridging opening, and the bridging circuit board is within the bridging opening.

14. The electronic device according to claim 12, wherein a gap between the bridging circuit board and the first shielding adhesive tape is equal to 0.3-0.8 mm.

15. The electronic device according to claim 12, wherein the main circuit board comprises at most two lead layers.

16. The electronic device according to claim 12, wherein the bridging circuit board comprises at most two lead layers.

17. The electronic device according to claim 12, wherein a thickness of the bridging circuit board is equal to 0.8-1.2 times a thickness of the first shielding adhesive tape.

18. The electronic device according to claim 12, wherein a thickness of the bridging circuit board is equal to 0.09-0.14 mm, and a thickness of the first shielding adhesive tape is equal to 0.09-0.14 mm.

* * * * *